United States Patent
Nieto et al.

(10) Patent No.: US 7,813,408 B2
(45) Date of Patent: Oct. 12, 2010

(54) WIRELESS COMMUNICATIONS DEVICE WITH WHITE GAUSSIAN NOISE GENERATOR AND RELATED METHODS

(75) Inventors: John Wesley Nieto, Rochester, NY (US); William Nelson Furman, Fairport, NY (US)

(73) Assignee: Harris Corporation, Melbourne, FL (US)

( * ) Notice: Subject to any disclaimer, the term of this patent is extended or adjusted under 35 U.S.C. 154(b) by 1600 days.

(21) Appl. No.: 11/000,828

(22) Filed: Dec. 1, 2004

(65) Prior Publication Data

US 2006/0114968 A1 Jun. 1, 2006

(51) Int. Cl.
H04B 1/69 (2006.01)
H04J 11/00 (2006.01)
G06F 7/58 (2006.01)
G06F 17/14 (2006.01)

(52) U.S. Cl. .................. 375/130; 370/209; 708/250; 708/252; 708/410

(58) Field of Classification Search .............. 375/130, 375/139, 142, 143, 150, 152, 260, 343; 370/208, 370/209; 708/250, 252, 253, 255, 256, 413, 708/410, 422, 426
See application file for complete search history.

(56) References Cited

U.S. PATENT DOCUMENTS

| | | | | |
|---|---|---|---|---|
| 4,078,255 A * | 3/1978 | Evans | .................... | 708/256 |
| 5,153,532 A * | 10/1992 | Albers et al. | .................... | 331/78 |
| 5,848,160 A * | 12/1998 | Cai et al. | .................... | 380/44 |
| 6,208,615 B1 * | 3/2001 | Faruque et al. | .................... | 370/209 |
| 6,662,327 B1 * | 12/2003 | Rajski | .................... | 714/738 |
| 6,999,983 B2 * | 2/2006 | Suzuki et al. | .................... | 708/250 |
| 2002/0034171 A1 * | 3/2002 | Smith et al. | .................... | 370/337 |
| 2003/0126551 A1 * | 7/2003 | Mantha et al. | .................... | 714/790 |
| 2005/0074052 A1 * | 4/2005 | Akada | .................... | 375/130 |

OTHER PUBLICATIONS

Lee et al., *A Hardware Gaussian Noise Generator for Channel Code Evaluation*, 11th Annual IEEE Symposium on Field-Programmable Custom Computing Machines, Apr. 9-11, 2003.
Ritter, *Walsh-Hadamard Transforms: A Literature Survey, Research Comments from Ciphers by Ritter*, available at www.ciphersbyritter.com/RES/WALHAD.HTM, Aug. 15, 1996.
Bahl, *Design and Prototyping a Fast Hadamard for WCDMA*, Proceedings IEEE Workshop on Rapid System Prototyping, Jun. 2003.

* cited by examiner

*Primary Examiner*—Young T. Tse
(74) *Attorney, Agent, or Firm*—Allen, Dyer, Doppelt, Milbrath & Gilchrist, P.A.

(57) ABSTRACT

A wireless communications device may include a wireless transmitter, a modulator connected to the wireless transmitter, and a white Gaussian noise generator connected to the modulator. The white Gaussian noise generator may include at least one pseudorandom number generator, and a fast Walsh transform module for generating white Gaussian noise based upon the pseudorandom numbers.

31 Claims, 7 Drawing Sheets

WIRELESS COMMUNICATIONS DEVICE WITH WHITE GAUSSIAN NOISE GENERATOR AND RELATED METHODS

FIELD OF THE INVENTION

The present invention relates to the field of communications systems, and, more particularly, to wireless communications systems and related methods.

BACKGROUND OF THE INVENTION

Wireless radio channels often exhibit time and frequency dispersion (i.e., delay spread and Doppler spread) due to the presence of signal reflectors or scatterers in the environment, as well as the relative motion of transmitters and receivers. As a result, the channel experiences distortion which can cause transmitted symbols to be incorrectly interpreted at the receiving device. Doppler spreading can cause the delay spread (i.e., multipath) to vary with time.

In addition to multipath channel fading, other sources of signal distortion may also be present in wireless communications. For example, white Gaussian noise is generated by many different sources, such as thermal noise, "black body" radiation from the earth or other warm objects, and from the sun. Accordingly, white Gaussian noise not only has to be taken into account in terrestrial-based wireless communications, it also becomes an important consideration in space-bourne wireless communications. That is, wireless communications in space may not suffer from multipath, terrain blockage, interference, etc., but white Guassian noise may still be problematic. An additive white Gaussian noise (AWGN) channel is one in which the only signal impediment is the linear addition of wideband white Gaussian noise with a constant spectral density.

As such, it is often desired to generate white Gaussian noise for use in testing and evaluating wireless communications systems. The transcendental mathematical functions typically used to generate Gaussian noise are fairly complex, and thus are often implemented with software on microprocessors or digital signal processors (DSPs), for example. Yet, as signal bandwidths increase, it becomes very computationally intensive to generate white Gaussian noise in this way. This is true of wideband waveforms due to the large number of noise samples that are required within a given period of time.

Another approach for generating white Gaussian noise is set forth in "A Hardware Gaussian Noise Generator for Channel Code Evaluation" by Lee et al, 11th Annual IEEE Symposium on Field-Programmable Custom Computing Machines, Apr. 9-11, 2003. This paper notes that hardware simulation of channel codes offers the potential of improving code evaluation speed by orders of magnitude over workstation- or PC-based simulation. A hardware-based Gaussian noise generator is described which is used as a key component in a hardware simulation system for exploring channel code behavior at very low bit error rates (BERs) in the range of $10^{-9}$ to $10^{-10}$. The generator uses non-uniform piecewise linear approximations in computing trigonometric and logarithmic functions. The parameters of the approximation are chosen to enable rapid computation of coefficients from the inputs, while still retaining high fidelity to the modelled functions. The output of the noise generator is said to model a true Gaussian probability distribution function (PDF) even at very high sigma values.

Despite such advancements in white Gaussian noise generation, other approaches may be desirable which do not require relatively complex trigonometric and logarithmic functions.

SUMMARY OF THE INVENTION

In view of the foregoing background, it is therefore an object of the present invention to provide a wireless communications device with enhanced white Gaussian noise generation capabilities and related methods.

This and other objects, features, and advantages in accordance with the present invention are provided by a wireless communications device which may include a wireless transmitter, a modulator connected to the wireless transmitter, and a white Gaussian noise generator connected to the modulator. The white Gaussian noise generator may include at least one pseudorandom number generator, and a fast Walsh transform module for generating white Gaussian noise based upon the pseudorandom numbers.

In particular, the fast Walsh transform module advantageously converts the distributed pseudorandom values, which may be uniform, to Gaussian distributed values. Moreover, since a fast Walsh transform may be implemented using straightforward addition and subtraction operations, rather than more complex trigonometric operations typically used in prior art approaches, the white Gaussian noise generator lends itself well to fast hardware implementations. By way of example, the white Gaussian noise generator may comprise a field-programmable gate array (FPGA).

The fast Walsh transform module may have a plurality of parallel outputs, and the white Gaussian noise generator may also include a mean control module connected to a desired one of the parallel outputs for selectively disconnecting the desired parallel output. By way of example, a first one of the parallel outputs may be selectively disconnected to provide zero mean white Gaussian noise. This may also advantageously be used to generate bi-polar noise from all positive or unsigned inputs, for example.

As noted above, the at least one pseudorandom number generator may be at least one uniform pseudorandom number generator. More particularly, the at least one uniform pseudorandom number generator may include a linear feedback shift register (LFSR). Furthermore, the LFSR may generate pseudorandom numbers using a polynomial.

In addition, the fast Walsh transform module may have a plurality of parallel outputs, and the white Gaussian noise generator may further include a parallel-to-serial converter connected to the parallel outputs of the fast Walsh transform module. Also, the at least one pseudorandom number generator may be at least one serial pseudorandom number generator, and the white Gaussian noise generator may also include a serial-to-parallel converter connected between the at least one serial pseudorandom number generator and the fast Walsh transform module. The wireless communications device may also include a demodulator connected to the white Gaussian noise generator, and a wireless receiver connected to the demodulator.

A method aspect of the invention is for generating white Gaussian noise. The method may include generating pseudorandom numbers, and generating white Gaussian noise by performing a fast Walsh transform based upon the pseudorandom numbers. A white Gaussian noise generator, such as the one described briefly above, is also provided.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
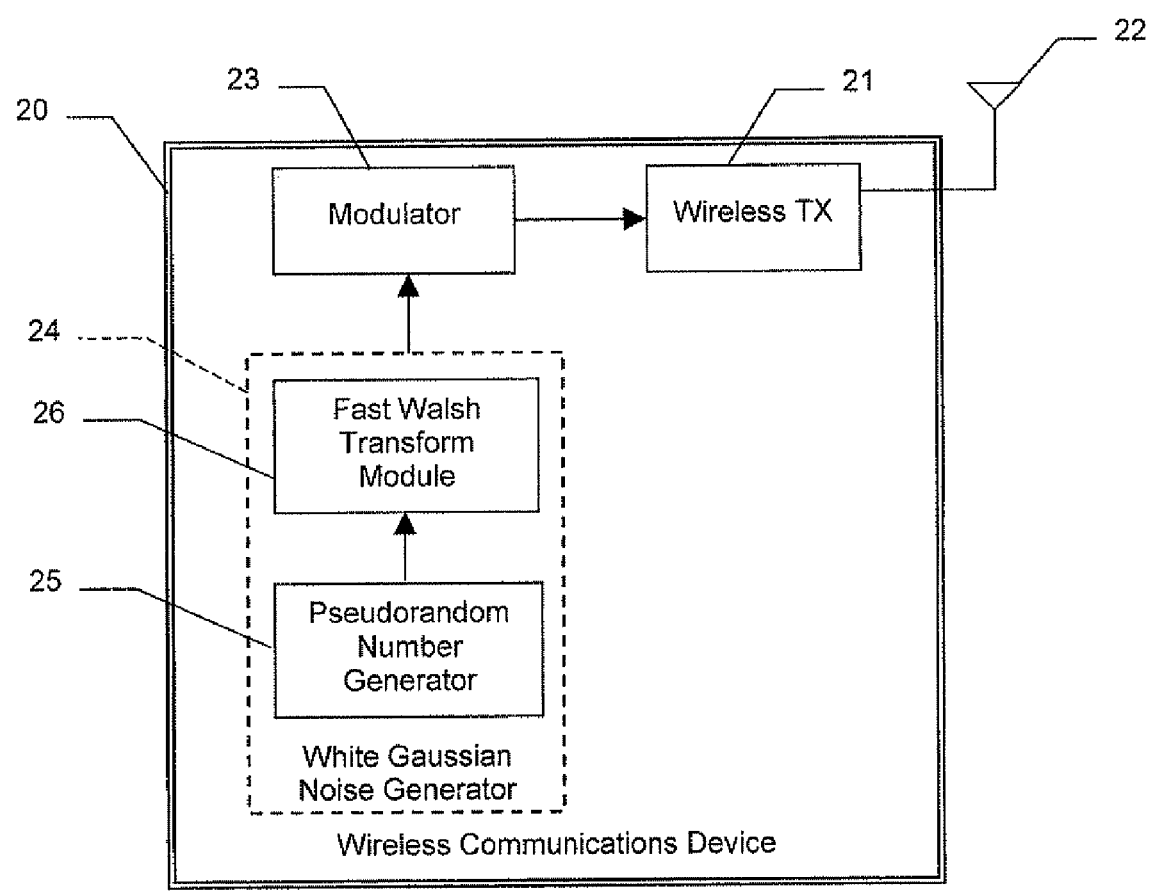
FIG. 1 is schematic block diagram of a wireless communications device including a white Gaussian noise generator in accordance with the present invention.

Referring initially to FIG. 1, a wireless communications device 20 in accordance with the present invention illustratively includes a wireless transmitter 21 and associated antenna 22, a modulator 23 connected to the wireless transmitter, and a white Gaussian noise generator 24 connected to the modulator. While not shown in the present example for clarity of illustration, it will be appreciated by those skilled in the art that the wireless communications device 20 may include other transmitter components (e.g., encoder, forward error correction (FEC), etc.), as well as receiver components (e.g., demodulator, decoder, etc.).

The white Gaussian noise generator 24 illustratively includes a pseudorandom number generator 25 and a fast Walsh transform module 26 for generating white Gaussian noise based upon the pseudorandom numbers, which are preferably uniformly distributed, as will be discussed below. The fast Walsh transform module implements a Walsh-Hadamard transform ("Walsh transform") to advantageously convert the uniform distributed pseudorandom values to Gaussian distributed values, as will be appreciated by those skilled in the art.

A fast Walsh transform may be implemented using straightforward addition and subtraction operations, rather than more complex transcendental mathematical functions typically used in prior art approaches. For example, a fast Walsh transform for N samples will require N·log 2N addition and subtraction operations to process. Accordingly, the white Gaussian noise generator 24 thus lends itself well to fast hardware implementations.

By way of example, the white Gaussian noise generator 24 may be implemented in a field-programmable gate array (FPGA), although other devices such as an application specific integrated circuit (ASIC) or DSP may be used in some embodiments as well. Other components, such as the modulator 23, for example, may also be implemented along with the white Gaussian noise generator 24 in the same ASIC in certain embodiments, if desired, as will be appreciated by those skilled in the art.

Figure 2:
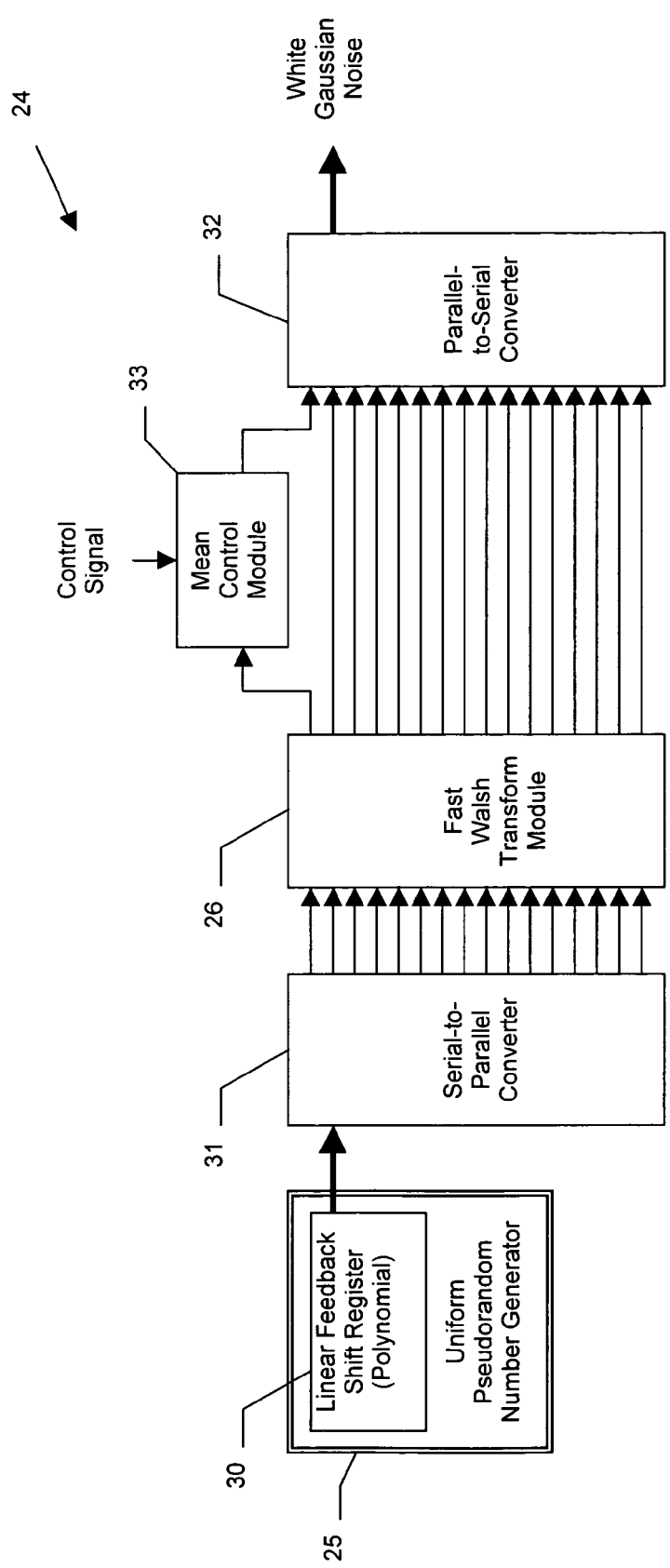
FIG. 2 is a more detailed schematic block diagram of the white Gaussian noise generator of the wireless communications device of FIG. 1.

Turning now additionally to FIG. 2, an exemplary embodiment of the white Gaussian noise generator 24 is now described in greater detail. One or more uniform pseudorandom number generators 25 may be implemented using a maximal-length linear feedback shift register (ML-LFSR) 30 where for implementation simplicity the generator polynomial for ML-LFSR sequence is a trinomial. However, it should be noted that other types of pseudorandom number generators may also be used.

The pseudorandom number generator 25 generates m-bit serial words for the fast Walsh transform module 26. The serial output of the pseudorandom number generator 25 is converted to parallel data by a serial-to-parallel converter 31 for the fast Walsh transform module 26. In some embodiments, the uniform pseudorandom number generator 25 may include a plurality of ML-LFSRs 30 providing the desired input configuration to the fast Walsh transform module 26 without the need for the serial-to-parallel converter 31, as will be appreciated by those skilled in the art. The fast Walsh transform module 26 provides an extremely efficient implementation of the Walsh transformation, which may be an orthogonal Walsh transform, for example. As noted above, the fast Walsh transform module 26 advantageously only needs to perform addition and subtraction operations rather than more complex multiplication operations required for transcendental functions.

The fast Walsh transform module 26 processes the parallel outputs from the serial-to-parallel converter 31, and the parallel outputs of the fast Walsh transform module may in turn be converted back to a serial data stream by a parallel-to-serial converter 32. The output of the parallel-to-serial converter 32 is white Gaussian noise, as will be discussed further below. An output buffer (not shown) may optionally be connected to the output of the parallel-to-serial converter 32 in some embodiments, if desired.

Figure 7:
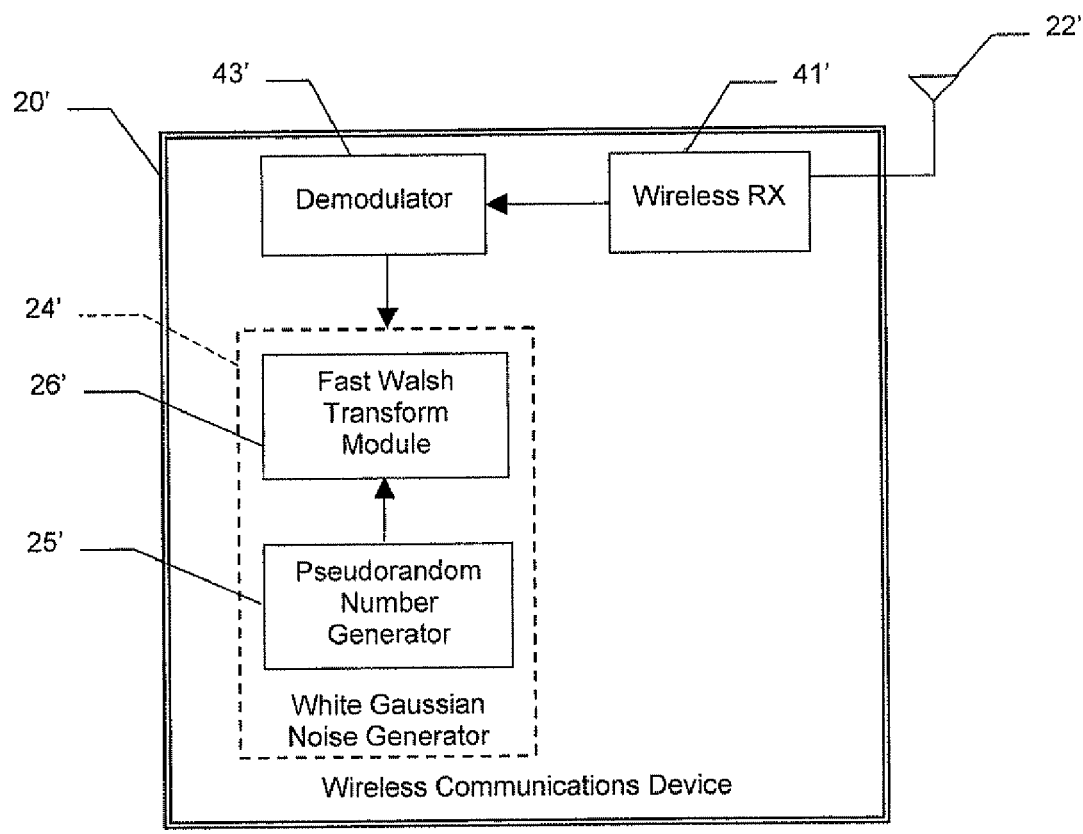
FIG. 7 is a is schematic block diagram of an alternate embodiment of the wireless communications device of FIG. 1.

Turning now additionally to FIG. 7, a white Gaussian noise generator 24' may also be included in a wireless communications device 20' and connected to a demodulator 43', which in turn is connected to a wireless receiver 41'. Thus, rather than introducing the white Gaussian noise during transmission as with the device 20 illustrated in FIG. 1, the white Gaussian noise may instead be introduced in the receive signal path prior to demodulation for test purposes, for example, as will be appreciated by those skilled in the art. Other embodiments are also possible, such as a device with a modulator/demodulator (modem) in which the white Gaussian noise generator 24' may be used in conjunction with modulation or demodulation operations.

In accordance with another advantageous aspect of the invention, a mean control module 33 may be connected in line with a desired output or outputs of the fast Walsh transform module 26 to selectively include or exclude the output(s) from the final output provided by the parallel-to-serial converter 32. In the illustrated example, the mean control module 33 selectively includes/excludes the first output of the fast Walsh transform module 26 based upon a control signal, which may be a user input control signal, for example. By excluding the first output of the fast Walsh transform module 26, the output white Gaussian noise samples advantageously have a mean or average of zero. The mean control module 33 may also be used to generate bi-polar noise from all positive or unsigned inputs, for example. The output sample stream from the parallel-to-serial converter 32 includes m+M bit white Gaussian noise samples, where M is the bit growth of the fast Walsh transform which is dependent upon the order or number of inputs of the fast Walsh transform module 26, as will be appreciated by those skilled in the art.

By implementing the white Gaussian noise generator 24 in the wireless communications device 20, testing may advantageously be performed in the field on an as needed basis, as will be appreciated by those skilled in the art. However, the white Gaussian noise generator 24 may be separately implemented in a dedicated device, such as a test device, for example, in other embodiments, or used in other applications where a source of white Gaussian noise is required.

Figure 3:
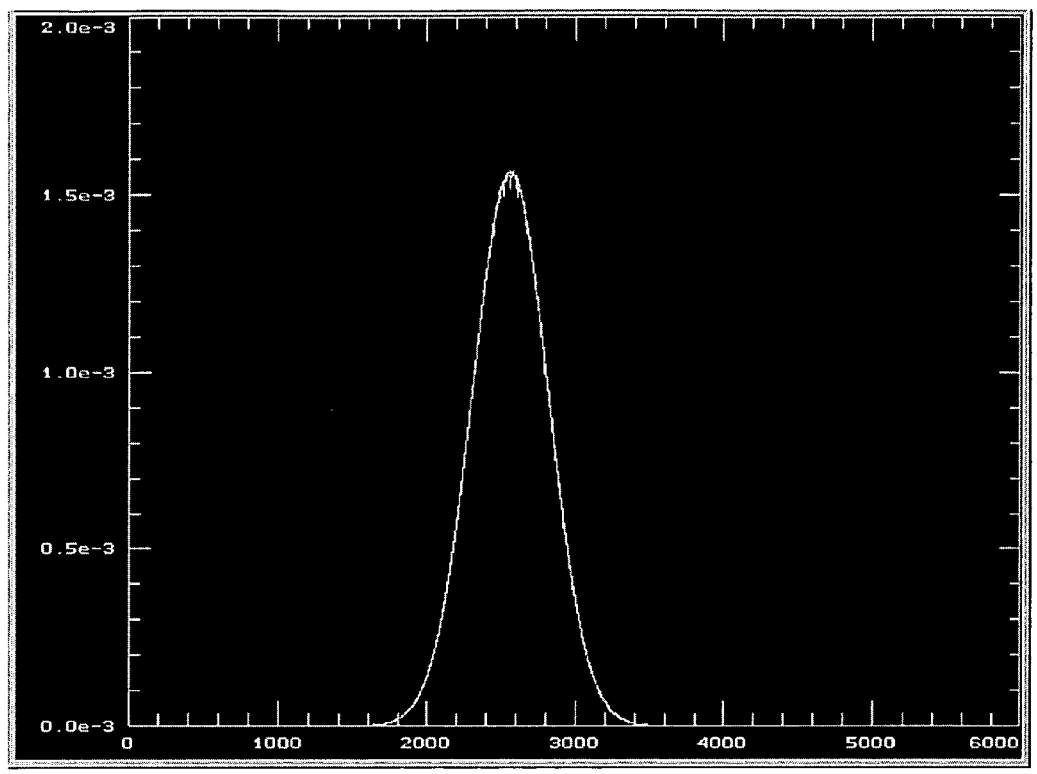
FIGS. 3 and 4 are graphs illustrating generated versus analytical probability distribution and cumulative distribution functions, respectively, of white Gaussian noise generated in accordance with the present invention.
Figure 4:
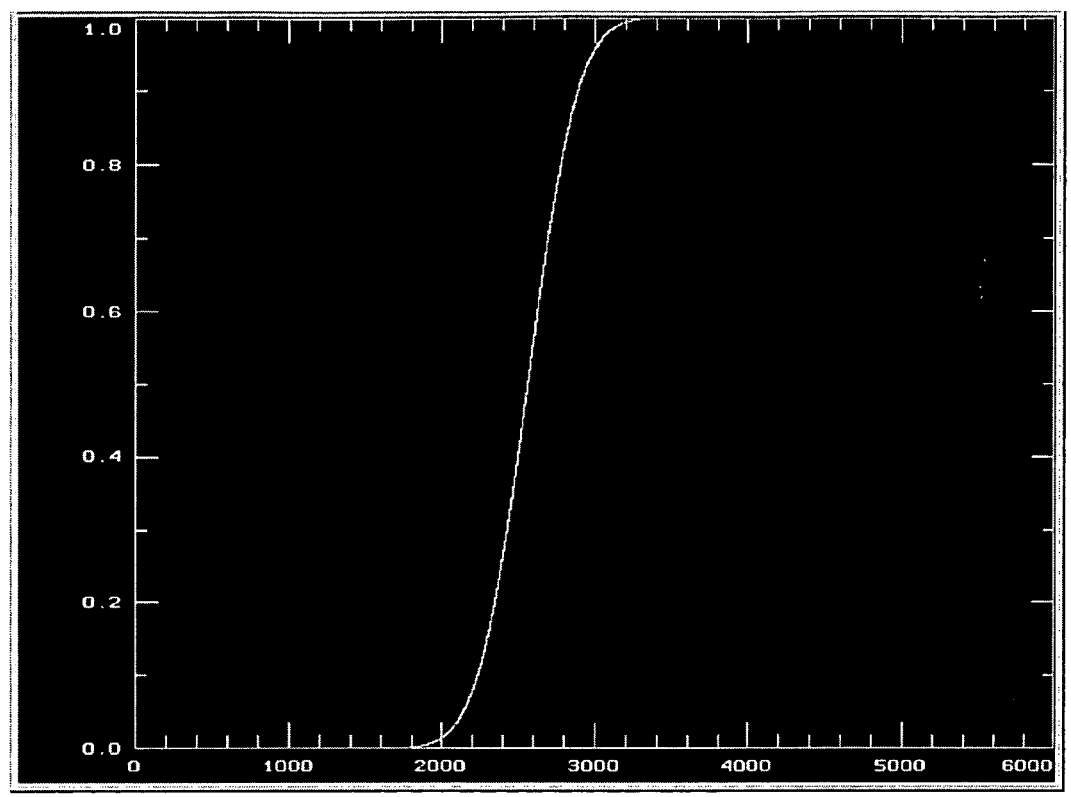

The above-described approach for generating white Gaussian noise has been simulated using a computer program, and a number of tests have been performed to validate the quality and independence of the white Gaussian noise process generated by this technique. The probability distribution function (PDF) and cumulative distribution function (CDF) of white Gaussian noise generated in accordance with the invention compared with the expected analytical PDF and CDF are shown in FIGS. 3 and 4, respectively.

Figure 5:
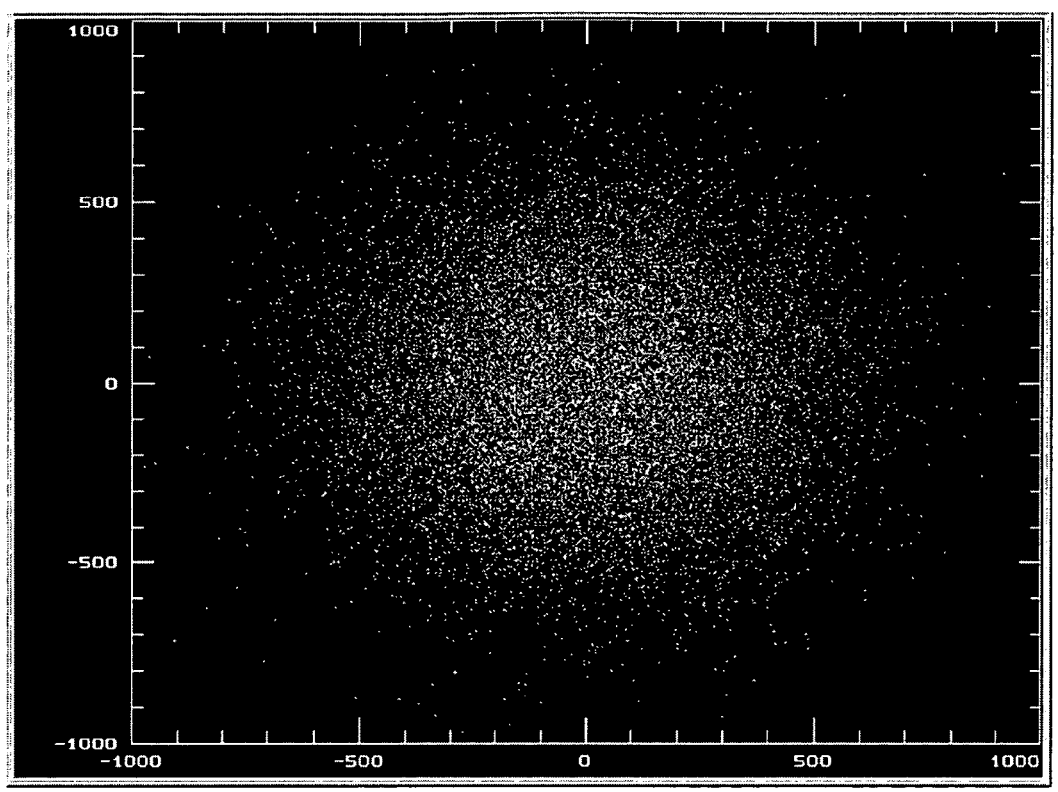
FIG. 5 is a graph of a scatter plot of white Gaussian noise generated in accordance with the present invention.

Turning now additionally to FIG. 5, a scatter plot of white Gaussian noise generated in accordance with the invention is shown where the x and y values are adjacent samples at the output. As will be appreciated by those skilled in the art, the lack of any non-uniform clustering implies that the samples obtained in accordance with the invention are statistically independent.

Figure 6:
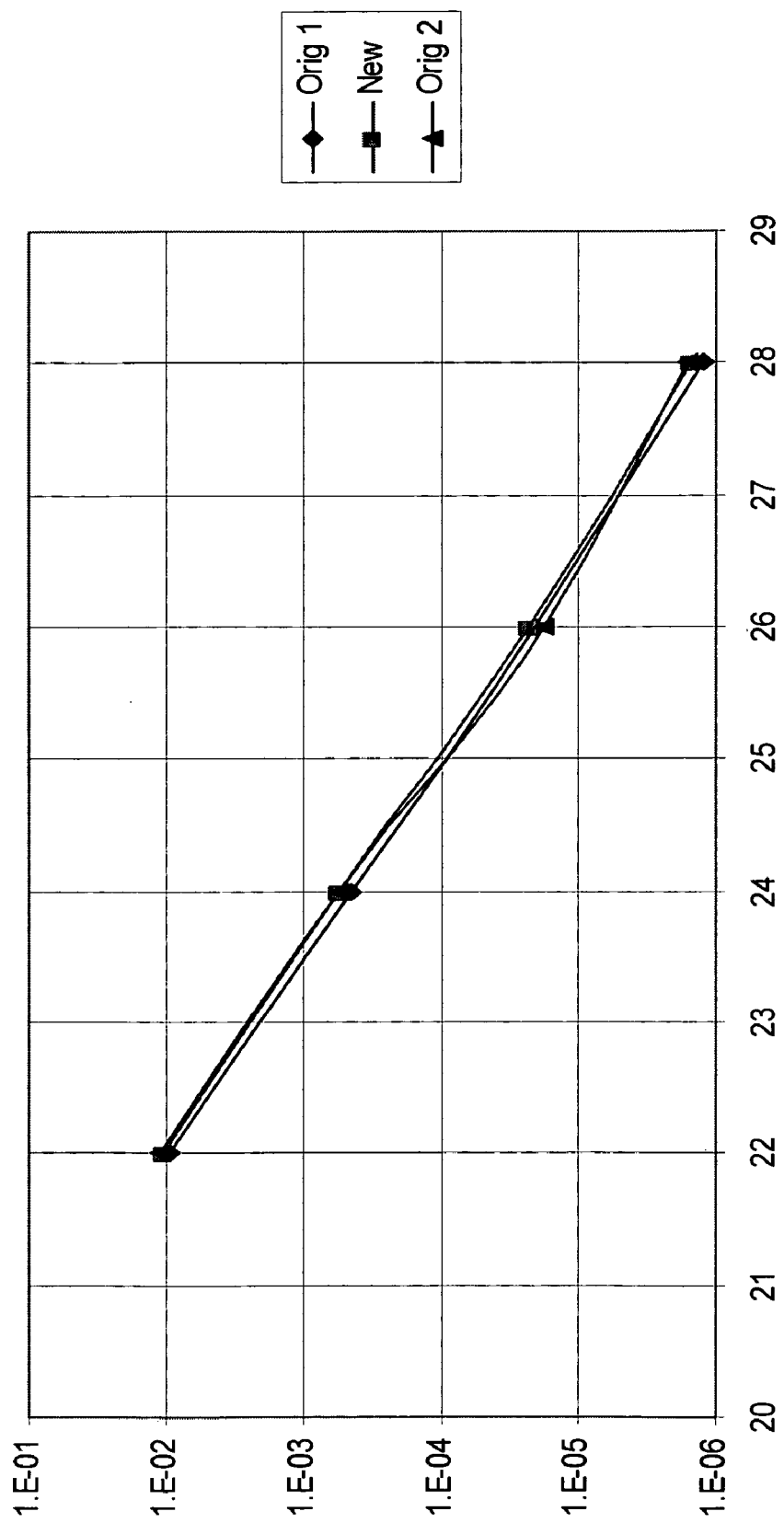
FIG. 6 is a graph comparing white Gaussian noise test data obtained in accordance with two prior art approaches and in accordance with the present invention.

The above-described white Gaussian noise generator 24 was also used to evaluate the performance of a 9600 bps HF data modem, and the results are shown in FIG. 6. The modem performance utilizing the Gaussian Noise generated in accordance with the present invention ("New") was compared to the modem performance measured utilizing two different implementations of a standard prior art floating point Box-Muller algorithm ("Orig 1" and "Orig 2"). As can be seen, the modem performance was nearly identical.

The present invention was further tested using a Kolmogov-Smirnov (K-S) test to provide a figure of merit into how close the generated noise was to theoretical Gaussian Noise. The K-S test was run for a number of different size fast Walsh transforms. In each case the generated noise was significantly Gaussian.

A method aspect of the invention for generating white Gaussian noise includes generating pseudorandom numbers, and generating white Gaussian noise by performing a fast Walsh transform based upon the pseudorandom numbers, as discussed above. Further method aspects will be appreciated based upon the foregoing discussion as well.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:
1. A wireless communications device comprising:
a wireless transmitter;
a modulator connected to said wireless transmitter; and
a white Gaussian noise generator connected to said modulator and comprising
at least one pseudorandom number generator for generating pseudorandom numbers,
a fast Walsh transform module for generating white Gaussian noise based upon the pseudorandom numbers and comprising a plurality of parallel outputs, and
a parallel-to-serial converter connected to the parallel outputs of said fast Walsh transform module.

2. The wireless communications device of claim 1 white Gaussian noise generator further comprises a mean control module connected to a desired one of the parallel outputs for selectively disconnecting the desired parallel output.

3. The wireless communications device of claim 2 wherein said mean control module selectively disconnects a first one of the parallel outputs to provide zero mean white Gaussian noise.

4. The wireless communications device of claim 1 said at least one pseudorandom number generator comprises at least one uniform pseudorandom number generator.

5. The wireless communications device of claim 4 wherein said at least one uniform pseudorandom number generator comprises a linear feedback shift register (LFSR).

6. The wireless communications device of claim 5 wherein said LFSR generates the pseudorandom numbers using a polynomial.

7. The wireless communications device of claim 1 further comprising a demodulator connected to said white Gaussian noise generator, and a wireless receiver connected to said demodulator.

8. The wireless communications device of claim 1 wherein said at least one pseudorandom number generator comprises at least one serial pseudorandom number generator; and wherein said white Gaussian noise generator further comprises a serial-to-parallel converter connected between said at least one serial pseudorandom number generator and said fast Walsh transform module.

9. The wireless communications device of claim 1 wherein said white Gaussian noise generator further comprises a field-programmable gate array (FPGA).

10. A wireless communications device comprising:
a wireless receiver;
a demodulator connected to said wireless receiver; and
a white Gaussian noise generator connected to said demodulator and comprising
at least one pseudorandom number generator for generating pseudorandom numbers,
a fast Walsh transform module for generating white Gaussian noise based upon the pseudorandom numbers and comprising a plurality of parallel outputs, and
a parallel-to-serial converter connected to the parallel outputs of said fast Walsh transform module.

11. The wireless communications device of claim 10 wherein said white Gaussian noise generator further comprises a mean control module connected to a desired one of the parallel outputs for selectively disconnecting the desired parallel output.

12. The wireless communications device of claim 11 wherein said mean control module selectively disconnects a first one of the parallel outputs to provide zero mean white Gaussian noise.

13. The wireless communications device of claim 10 wherein, said at least one pseudorandom number generator comprises at least one uniform pseudorandom number generator.

14. The wireless communications device of claim 13 wherein said at least one uniform pseudorandom number generator comprises a linear feedback shift register (LFSR).

15. The wireless communications device of claim 14 wherein said LFSR generates the pseudorandom numbers using a polynomial.

16. The wireless communications device of claim 10 wherein said at least one pseudorandom number generator comprises at least one uniform serial pseudorandom number generator; and wherein said white Gaussian noise generator further comprises a serial-to-parallel converter connected between said at least one uniform serial pseudorandom number generator and said fast Walsh transform module.

17. The wireless communications device of claim 10 wherein said white Gaussian noise generator further comprises a field-programmable gate array (FPGA).

18. A white Gaussian noise generator comprising:
   at least one pseudorandom number generator for generating pseudorandom numbers;
   a fast Walsh transform module for generating white Gaussian noise based upon the pseudorandom numbers and comprising a plurality of parallel outputs; and
   a parallel-to-serial converter connected to the parallel outputs of said fast Walsh transform module.

19. The white Gaussian noise generator of claim 18 a mean control module connected to a desired one of the parallel outputs for selectively disconnecting the desired parallel output.

20. The white Gaussian noise generator of claim 18 wherein said at least one pseudorandom number generator comprises at least one uniform pseudorandom number generator.

21. The white Gaussian noise generator of claim 20 wherein said at least one uniform pseudorandom number generator comprises a linear feedback shift register (LFSR).

22. The white Gaussian noise generator of claim 21 wherein said LFSR generates the pseudorandom numbers using a polynomial.

23. The white Gaussian noise generator of claim 18 wherein said at least one pseudorandom number generator comprises at least one serial pseudorandom number generator; and wherein said white Gaussian noise generator further comprises a serial-to-parallel converter connected between said at least one serial pseudorandom number generator and said fast Walsh transform module.

24. The white Gaussian noise generator of claim 18 further comprises a field-programmable gate array (FPGA).

25. A wireless communications device comprising:
   a wireless transmitter;
   a modulator connected to said wireless transmitter; and
   a white Gaussian noise generator connected to said modulator and comprising
      at least one serial pseudorandom number generator for generating pseudorandom numbers,
      a fast Walsh transform module for generating white Gaussian noise based upon the pseudorandom numbers, and
      a serial-to-parallel converter connected between said at least one serial pseudorandom number generator and said fast Walsh transform module.

26. The wireless communications device of claim 25 wherein said fast Walsh transform module comprises a plurality of parallel outputs; and wherein said white Gaussian noise generator further comprises a mean control module connected to a desired one of the parallel outputs for selectively disconnecting the desired parallel output.

27. The wireless communications device of claim 25 further comprising a demodulator connected to said white Gaussian noise generator, and a wireless receiver connected to said demodulator.

28. A wireless communications device comprising:
   a wireless receiver;
   a demodulator connected to said wireless receiver; and
   a white Gaussian noise generator connected to said demodulator and comprising
      at least one uniform pseudorandom number generator for generating pseudorandom numbers,
      a fast Walsh transform module for generating white Gaussian noise based upon the pseudorandom numbers, and
      a serial-to-parallel converter connected between said at least one uniform serial pseudorandom number generator and said fast Walsh transform module.

29. The wireless communications device of claim 28 wherein said fast Walsh transform module comprises a plurality of parallel outputs; and wherein said white Gaussian noise generator further comprises a mean control module connected to a desired one of the parallel outputs for selectively disconnecting the desired parallel output.

30. A white Gaussian noise generator comprising:
   at least one serial pseudorandom number generator for generating pseudorandom numbers;
   a fast Walsh transform module for generating white Gaussian noise based upon the pseudorandom, and
   a serial-to-parallel converter connected between said at least one serial pseudorandom number generator and said fast Walsh transform module.

31. The white Gaussian noise generator of claim 30 wherein said fast Walsh transform module comprises a plurality of parallel outputs; and further comprising a mean control module connected to a desired one of the parallel outputs for selectively disconnecting the desired parallel output.

* * * * *